United States Patent [19]

Cahill

[11] 4,000,558
[45] Jan. 4, 1977

[54] PROCESS OF FABRICATING WIRING HARNESS

[75] Inventor: Robert Francis Cahill, Westport, Conn.

[73] Assignee: International Telephone and Telegraph, New York, N.Y.

[22] Filed: June 12, 1973

[21] Appl. No.: 369,322

Related U.S. Application Data

[63] Continuation of Ser. No. 189,174, Oct. 14, 1971, abandoned.

[52] U.S. Cl. .......................... 29/625; 29/203 MW; 174/68.5
[51] Int. Cl.² ......................................... B41M 3/08
[58] Field of Search .......... 29/624, 625, 627, 203 B, 29/203 J, 203 L, 203 MW, 203 R; 174/68.5, 72 A, 72 TR, 117 F, 117 FF, 117 A, 117 PC

[56] References Cited
UNITED STATES PATENTS

| 3,377,678 | 4/1968 | Eick et al. | 29/625 |
| 3,674,914 | 7/1972 | Burr | 29/625 X |

*Primary Examiner*—James R. Duzan
*Attorney, Agent, or Firm*—J. B. Raden; M. M. Chaban

[57] ABSTRACT

A wiring harness in the form of a sandwich of insulating sheets is formed by automatic means. The sheets are held together by adhesive and enclose an inner layer of conductors. Openings through the walls of the insulating sheets provide access to the conductors for external wiring. Spacing is provided along the edge of at least one insulating sheet to enable flattened ends of the inner layer of conductors to protrude as terminals available for connection to additional external wiring.

5 Claims, 3 Drawing Figures

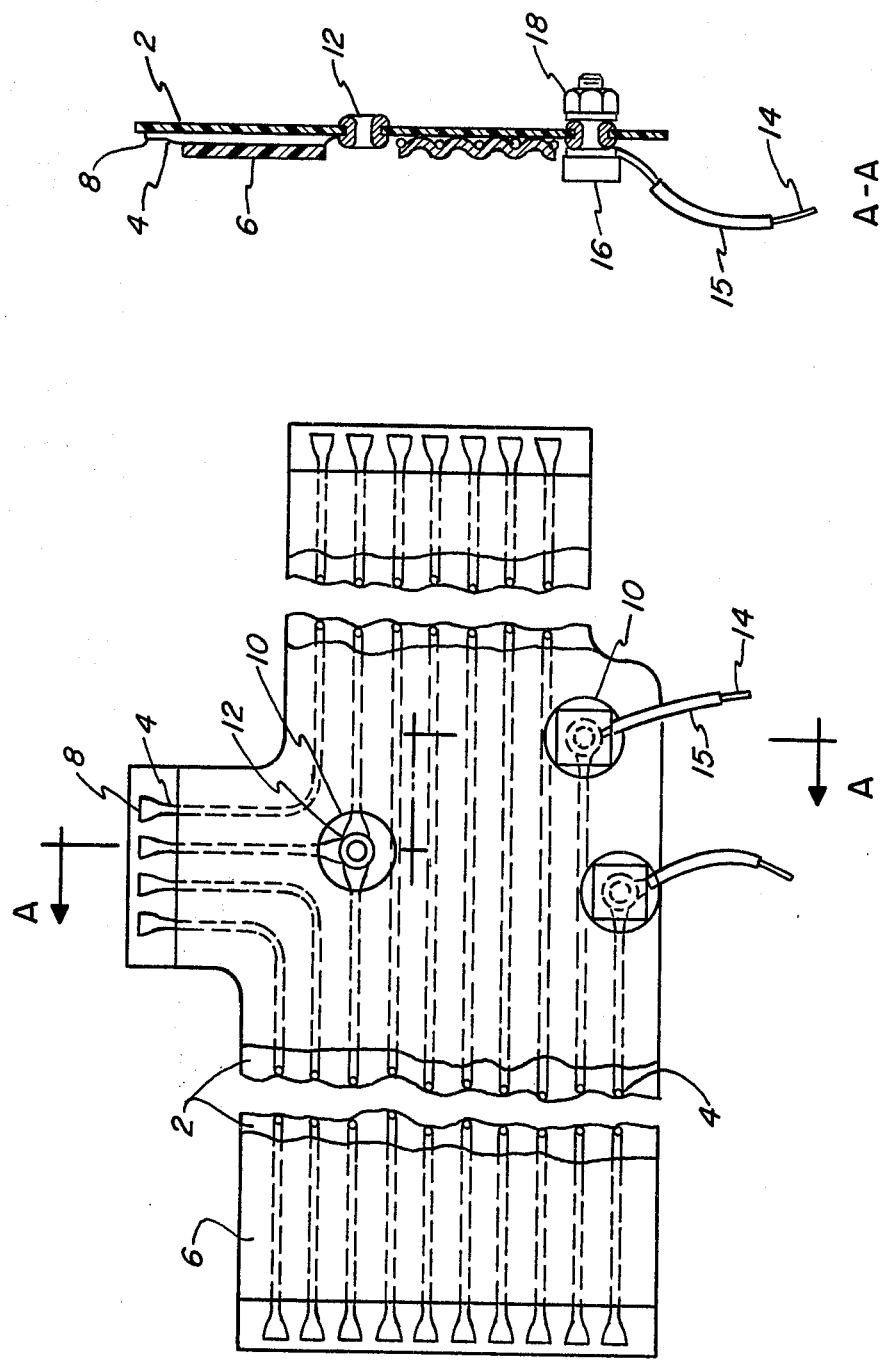

PROCESS OF FABRICATING WIRING HARNESS

This is a continuation of application Ser. No. 189,174 filed Oct. 14, 1971, now abandoned.

BACKGROUND OF THE INVENTION

The present invention relates to flexible wiring harnesses. It particularly relates to wiring harnesses in which flexible sheets are bonded to conductors to form a strong, flexible and corrosion resistant lamination.

In the manufacture of flexible printed wiring harnesses, a number of approaches have been used. A first of these may be called die-cut and glue. By this process a copper conductor is die cut in the desired configuration and is the glued to a plastic backing sheet. This process is generally limited to comparatively small sheets in sizes ranging up to eighteen inches in length.

A second known approach may be called the print and etch method. In this process, copper is laminated to a plastic backing. The copper is covered then with "photoresist." The uncured photoresist is covered with a high contrast negative of the final circuit which is then exposed to ultraviolet light. The light hardens the photoresist under transparent areas of the negative. The still soft photoresist corresponding to the opaque areas of the negative is washed off. The remaining sandwich is flooded (most efficiently by spraying) with a material that dissolves copper but not hardened photoresist or plastic backing. After the unwanted copper has been etched away, the remaining assembly is washed and another material is used to dissolve the remaining photoresist.

This second process involves many steps including the use of a number of chemicals which must be regenerated or replaced frequently. Regeneration involves a lot of chemical equipment while replacement means throwing away all remaining effective material as well as the used up portion. The amount of copper which must be reclaimed or is otherwise wasted is a large proportion of the copper actually remaining in use. Other problems arise, such as undercutting of the remaining copper so that the completed product is frequently unsatisfactory. Finally, the level of labor, skill and interest required by this process is high.

In a third process, a plastic base is printed with a pattern of suitable conductive material. The pattern is then electroplated with copper. The major disadvantage of this technique is the length of time necessary to develop plating of the desired thickness which must approximate 0.010 inch thickness.

Using any of these techniques, the end product produced may have conductors having varied cross-sections resulting in varied resistance characteristics, which is undesirable in many applications.

SUMMARY OF THE INVENTION

In view of the shortcomings of the prior art, objects of the invention include the provision of new and improved wiring harnesses and a method for fabrication of such harnesses.

It is a further object of the invention to provide an improved wiring harness which may be fabricated by automatic production techniques.

It is another object of the invention to provide a new and improved process for fabricating a wiring harness using automatic production techniques.

It is still a further object of the invention to provide a method for fabricating a wiring harness which avoids the waste of material characteristic of methods employed in the prior art.

It is yet another object of the invention to provide a wiring harness having greater structural strength than that characteristic of wiring harnesses in the prior art.

The present invention involves the function of wiring harness using a flexible plastic sheet cut to shape and having adhesive on one face thereof. By the use of suitable automatic equipment, wire may be placed on the sheet in a desired pattern. Eyelets are inserted into holes which have been previously perforated in the sheet and, finally, a cover sheet of flexible plastic is compressed into place on the lower sheet. The eyelets are arranged to contact the wire inside the lamination, thereby completing electrical contacts through the plastic sheets. The wires are flattened at one end and arranged to protrude out from under at least one sheet of plastic to form contact areas.

BRIEF DESCRIPTION OF THE DRAWINGS

FIGS. 1, 2 and 3 illustrate details relating to a wiring harness constructed in accordance with the present invention.

FIG. 1 shows a plan view partially cut away to illustrate certain features, while FIG. 2 is a sectional view taken from FIG. 1 along the lines A—A to illustrate additional aspects of the invention.

FIG. 3 illustrates further details relating to practice of the invention.

DESCRIPTION OF PREFERRED EMBODIMENTS

Figure 3:
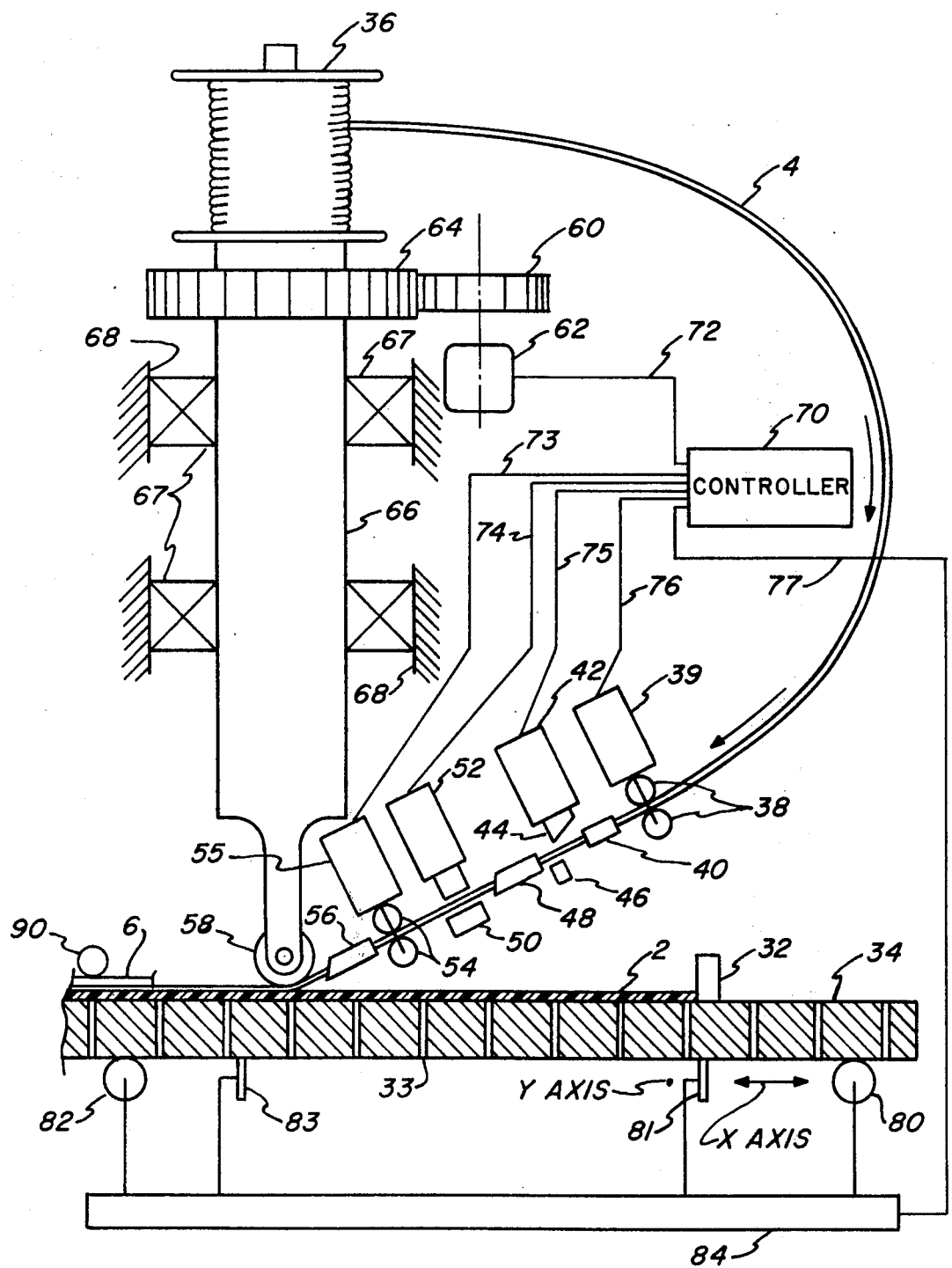

In FIG. 1, a flexible plastic insulating sheet is illustrated at 2. This plastic sheet serves as the lower sheet upon which a layer of adhesive (not shown) may be placed to serve as a retainer for uninsulated wires at 4 and an upper sheet 6 of flexible plastic insulating material. Flat segments 8 on the wire 4 serve as plug-in connectors. Holes at 10 in the upper plastic sheet are provided to enable connections or taps to the wires 4. A crimped eylet at 12 provides a reinforced opening through which connections may be made between the wires 4 and additional wires at 14 as by a coupling formed by a bolt 16 and nut 18. The wires 14 may be insulated as indicated at 15.

A preferred process for forming the wiring harness of FIGS. 1 and 2 is illustrated in FIG. 3. In the practice of the process, the lower plastic sheet 2 is adhesive coated and diecut to final shape, including eyelet holes, in a separate process not considered a part of this diclosure. The lower plastic sheet 2 is placed adhesive side up over vacuum hold-down tubes 33 in a positioning jig 32 located on a platen 34. The platen is movable along X and Y axes in accordance with a predetermined program.

In the practice of the process, uninsulated wire 4 is unreeled from a spool 36 through power driven drive rolls 38 under control of controller 70 and an actuator at 39. The wire progresses through a guide tube 40 to cut-off actuator 42 which, in response to control signals from a controller 70, operates a cut-off blade 44 to sever the wire to a required length by shearing action against an anvil 46. The wire is then fed through the guide tube 48 and over the flattening anvil 50 where the flattening actuator 52 is operated to flatten the severed end of the wire to form the flattened wire end shown at 8 in FIGS. 1 and 2. A tape control or other programable controller, indicated at 70 synchronizes the various operations referred to above and elsewhere in the disclosure through lines such as those indicated at 72, 73, 74, 75, 76 and 77.

The wire 4 is fed through power driven drive rolls 54, guide tube 56 and under a press-down wheel 58 onto the adhesive coated surface of the lower plastic sheet 2. As additional wire is supplied by the power driven guide rolls 38 and 54 the pattern made by the wire is established by movement of the platen along the X and Y axes. Movement of the platen is directed by the programable controller 70, mentioned above, through operation of positioning means indicated symbolically by drive wheels 80, 81, 82 and 83 and the block at 84. The rotation gears 60 and 64 are also directed via a drive mechanism at 62 under control of the programmable controller 70 to keep the press-down wheel 58 aligned and in this way provide an additional measure of control over wire travel over the moving platen 34. The rotation gears 60 and 64, it will be seen, drive the press-down wheel through a shaft 66 supported in bearings 67 within a frame 68. In this connection, sufficiently accurate results for some purposes may be obtained by caster mounting of the press-down wheel 58 and allowing the position of platen 34 to determine the actual pattern of wiring.

At the end of a wire run, the wire is cut-off by the cut-off actuator knife 44 against the cut-off anvil 46. The wire is advanced through the guide tube 48 until the end is in position to be flattened by the flattening actuator 52 against the flattening anvil 50. The wire is advanced through the power driven rolls 54 and the guide tube 56 until the flattened end is pressed against the adhesive coated plastic sheet 2 by the press-down wheel 58 to complete one wire circuit. The manufacturing sequence is then restarted for the next run of wire, and the entire process is repeated.

After all the wires are in place, the platen is directed by the controller 70 (by means not shown) to move to an appropriate position under an eyelet inserter (not shown). A sealing die for the eyelet then cuts into the plastic sheet.

The upper plastic sheet 6 of FIGS. 1 and 2 is then added and pressed into position on the platen 34 to form a complete wiring harness. Such a plastic sheet 6 may be pressed into position by a roller such as 90. The roller 90 may be under control of the controller 70, or be separately controlled.

I claim:

1. A method of forming flexible wiring harnesses comprising
    placing an adhesive coated first flexible plastic sheet, adhesive side up, in contact with a positioning jig and a platen,
    applying a vacuum through hold-down tubes to temporarily maintain said flexible plastic sheet in contact with the positioning jig and platen,
    unreeling a conductive wire from a spool under control of an actuator,
    feeding said wire under control of a controller to a cut-off actuator,
    cutting said wire after a prescribed length of wire has passed said cut-off actuator,
    feeding said wire under controls of the controller between a flattening actuator and an anvil,
    flattening said wire on said anvil at prescribed places,
    feeding said wire under a press-down wheel onto the adhesive coated plastic sheet,
    positioning the press-down wheel, under control of the controller, to guide said wire and to press it down continuously in a chosen pattern onto the adhesive coated plastic sheet,
    moving the platen relative to X and Y axes in accordance with a pre-determined program to locate the conductive wire on the first plastic sheet in accordance with the desired pattern,
    placing a second flexible plastic sheet over the adhesive surface to cover the wire and the first flexible plastic sheet,
    feeding the second flexible plastic sheet, the wire and first flexible plastic sheet under a roller, and
    pressing the second flexible plastic sheet into position under the roller and against the wire and the first flexible sheet to form a flexible wiring harness.

2. A method according to claim 1, including the further steps of
    providing openings in the second plastic sheet corresponding to desired terminal points and
    placing an eyelet through openings in the first plastic sheet adjacent to the openings in the second sheet to engage and hold the conductive wire securely to the second sheet and provide means to which electrical connections may be established.

3. A method according to claim 1, including the further steps of
    feeding additional conductive wires onto the adhesive coated plastic sheet in accordance with said predetermined program to provide additional elements of a flexible wiring harness, and
    feeding the wire through a guide tube following each feeding step to assure it follows a prescribed path.

4. A method according to claim 1, including the step, after the conductive wire has been cut to a prescribed length, of
    flattening the severed end of the wire against the anvil to form a flattened end for an electrical contact.

5. A method according to claim 1, including the steps of
    locating the flattened end for an electrical contact in a position relative to one of the plastic sheets to form an exposed contact.

* * * * *